US007596166B2

(12) United States Patent
Hongou

(10) Patent No.: US 7,596,166 B2
(45) Date of Patent: Sep. 29, 2009

(54) INTEGRATED CIRCUIT DEVICE INCLUDING A SPECTRUM SPREAD CLOCK GENERATOR, METHOD FOR CONTROLLING THE DEVICE, AND INK-JET RECORDING APPARATUS INCLUDING THE DEVICE

(75) Inventor: Masayuki Hongou, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 1053 days.

(21) Appl. No.: 10/244,517

(22) Filed: Sep. 17, 2002

(65) Prior Publication Data

US 2003/0063193 A1 Apr. 3, 2003

(30) Foreign Application Priority Data

Oct. 3, 2001 (JP) ............................ 2001-307464

(51) Int. Cl.
*H04B 1/00* (2006.01)
*H03K 5/01* (2006.01)

(52) U.S. Cl. ....................... 375/130; 375/141; 375/377; 327/100; 327/113; 327/143

(58) Field of Classification Search ......... 327/147–159, 327/141, 117, 291, 292, 293, 105, 269–271, 327/276–277, 100, 113, 143, 161, 294; 375/130–376, 375/377; 331/10, 17–34, 36, 45, 67, 68, 331/78; 713/500, 501, 401, 503; 358/401, 358/501, 412–417
See application file for complete search history.

(56) References Cited

U.S. PATENT DOCUMENTS

| | | | | |
|---|---|---|---|---|
| 5,167,024 | A * | 11/1992 | Smith et al. | 713/322 |
| 5,923,820 | A * | 7/1999 | Cunnagin et al. | 358/1.8 |
| 5,978,943 | A * | 11/1999 | Narukawa | 714/725 |
| 6,009,319 | A * | 12/1999 | Khullar et al. | 340/7.38 |
| 6,014,063 | A * | 1/2000 | Liu et al. | 331/78 |
| 6,024,439 | A * | 2/2000 | Sueoka et al. | 347/50 |
| 6,026,498 | A * | 2/2000 | Fuse et al. | 713/600 |
| 6,167,103 | A * | 12/2000 | Hardin | 375/376 |
| 6,294,936 | B1 * | 9/2001 | Clementi | 327/156 |
| 6,553,057 | B1 * | 4/2003 | Sha et al. | 375/130 |
| 6,597,226 | B1 * | 7/2003 | Eade et al. | 327/292 |
| 6,658,043 | B2 * | 12/2003 | Hardin et al. | 375/130 |
| 6,850,554 | B1 * | 2/2005 | Sha et al. | 375/140 |
| 7,010,706 | B2 * | 3/2006 | Clark et al. | 713/320 |
| 7,113,294 | B2 * | 9/2006 | Katsu | 358/1.14 |

* cited by examiner

*Primary Examiner*—Mohammad H Ghayour
*Assistant Examiner*—Sophia Vlahos
(74) *Attorney, Agent, or Firm*—Fitzpatrick, Cella, Harper & Scinto.

(57) ABSTRACT

An integrated circuit device is provided including a plurality of circuit blocks which operate based on a clock signal. The quartz oscillation circuit outputs a first clock signal. A spectrum spread clock generator outputs a second clock signal having a spread frequency. A clock signal is output to the plurality of circuit blocks and, based on an instruction to output the clock signal from a CPU, a clock signal output to the plurality of circuit blocks is switched from the second clock signal to the first clock signal.

4 Claims, 11 Drawing Sheets

INTEGRATED CIRCUIT DEVICE INCLUDING A SPECTRUM SPREAD CLOCK GENERATOR, METHOD FOR CONTROLLING THE DEVICE, AND INK-JET RECORDING APPARATUS INCLUDING THE DEVICE

BACKGROUND OF THE INVENTION

1. Field of the Invention

The present invention relates to a control for suppressing power consumption in a recording apparatus that uses a spectrum spread function in clock generation means.

2. Description of the Related Art

In conventional recording apparatuses (printers), in order to cope with improvements in image quality, and increases in image recording speeds, a complicated control circuit is required, and the operational speed of such control circuits is increasing. As a result, the frequency of a clock signal supplied to the control circuit also increases, and, among other consequences, the level of EMI (electromagnetic interference) noise radiated from an ASIC (application specific integrated circuit) having a large circuit scale is becoming high.

In order to deal with the aforesaid problems associated with increased clock signal frequency, a semiconductor device called a spectrum spread clock generator (abbreviated as an “SSCG”) has been used. In spectrum spreading, the frequency of a clock signal, which fixed frequency obtained from a frequency oscillator, such as a quartz oscillator or the like, is periodically changed. By performing spectrum spreading in a spectrum spread clock generator, the generation of EMI noise can be suppressed by spreading the frequency for generating EMI noise from a circuit.

Recently, energy saving in printers is being requested, and, in response, a CPU (central processing unit) is typically provided in a control circuit waiting in an energy saving mode when a printing apparatus is in a standby state in which a recording operation is not performed. In one approach, to perform recording operation, a printer shifts from the energy saving mode to a normal or operation mode by performing a key operation on an operation panel provided in a recording apparatus. In another approach, such a shift from the energy saving mode to the normal or operation mode can be performed by an instruction from software (a printer driver or the like) operating in a host computer or the like. Further, some apparatuses have an automatic power-off function, by which they shift to an energy saving mode when a predetermined time period has elapsed after a recording operation.

In spectrum spread clock generators, however, although the generation of EMI noise can be suppressed, power consumption is relatively large compared with other semiconductor devices, resulting in an increase in power consumption in a circuit using a spectrum spread clock generator. Such an increase in power consumption causes a problem in an apparatus including a spectrum spread clock generator, such as a printer or the like, when, for example, it is intended to set power consumption in a standby state to a value equal to or less than 0.1 W.

SUMMARY OF THE INVENTION

It is an object of the present invention to provide an integrated circuit device, a method for controlling the device, and an ink-jet recording apparatus having the device, in which the above-described problems are solved.

According to one aspect of the present invention, a control circuit includes an integrated circuit including a plurality of circuit blocks which operate based on a clock signal and a CPU (central processing unit), a quartz oscillation circuit that outputs a first clock signal to the integrated circuit, and a spectrum spread clock generator that outputs a second clock signal having a frequency that is spread, by inputting the first clock signal. Based on an instruction to output the clock signal from the CPU, a clock signal output to the plurality of circuit blocks is switched from the second clock signal to the first clock signal According to another aspect of the present invention, a method of controlling an integrated circuit device including a plurality of circuit blocks which operate based on a clock signal includes a first-clock-signal generation step, a second-clock-signal generation step, and a switching step. The first-clock-signal generation step outputs a first clock signal. The second-clock-signal generation step outputs a second clock signal having a frequency that is spread based on the first clock signal. The switching step switches, based on an instruction to output the clock signal from a CPU, a clock signal to be output to the plurality of circuit blocks from the second clock signal to the first clock signal According to still another aspect of the present invention, an ink-jet recording apparatus that performs recording using a recording head includes operation instruction means for outputting an instruction signal for instructing an operation of the apparatus, a quartz oscillation circuit that outputs a first clock signal, a spectrum spread clock generator that outputs a second clock signal having a frequency that is spread by inputting the first clock signal, and an integrated circuit including a plurality of circuit blocks that operate based on a clock signal, and a CPU. The integrated circuit performs processing of switching from the second clock signal to the first clock signal, as a clock signal to be output to the plurality of circuit blocks, based on an instruction to output the clock signal from the CPU, and outputting the first clock signal to the plurality of circuit blocks, based on the instruction to output the clock signal from the CPU, provided in response to the instruction signal from the operation instruction means.

According to still another aspect of the present invention, a computer readable storage medium stores computer code for executing a method of controlling an integrated circuit device including a plurality of circuit blocks which operate based on a clock signal includes a first-clock-signal generation step, a second-clock-signal generation step, and a switching step. The first-clock-signal generation step outputs a first clock signal. The second-clock-signal generation step outputs a second clock signal having a frequency that is spread based on the first clock signal. The switching step switches, based on an instruction to output the clock signal from a CPU, a clock signal to be output to the plurality of circuit blocks from the second clock signal to the first clock signal.

The foregoing and other objects, advantages and features of the present invention will become more apparent from the following detailed description of the preferred embodiments taken in conjunction with the accompanying drawings.

DETAILED DESCRIPTION OF THE PREFERRED EMBODIMENTS

Figure 1:
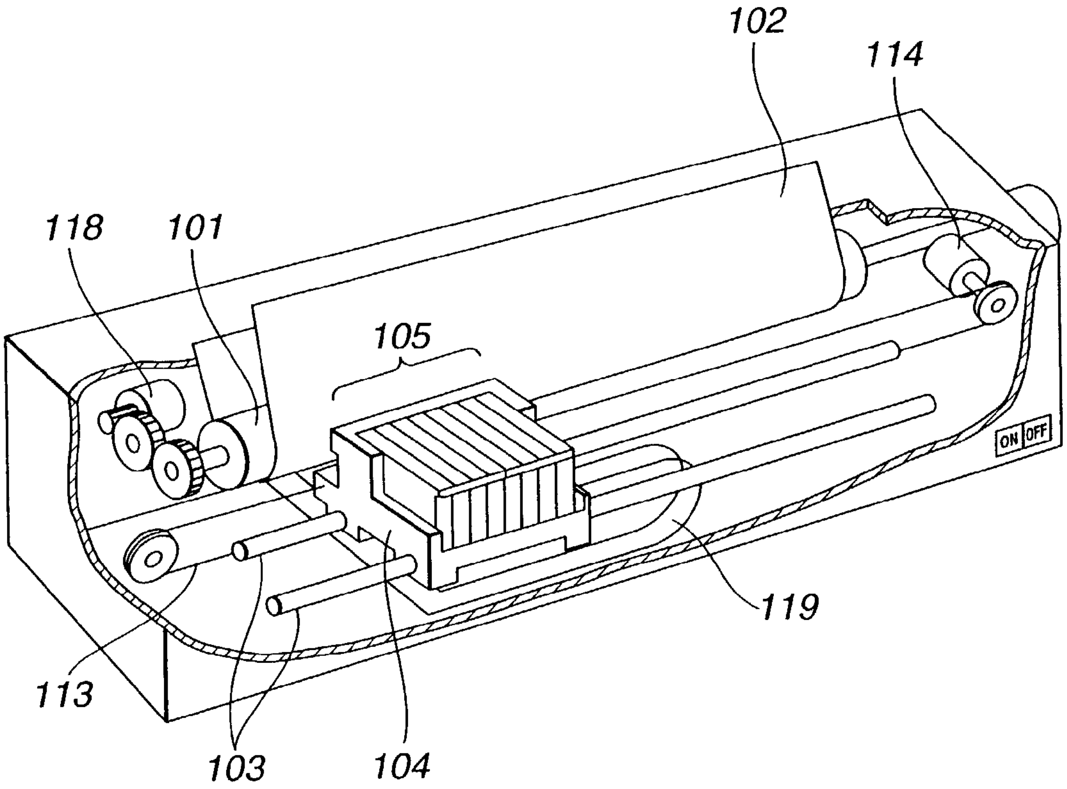
FIG. 1 is a perspective view illustrating a printer according to the present invention.

FIG. 1 is a perspective view illustrating an ink-jet recording apparatus (printer) according to a preferred embodiment of the present invention. In FIG. 1, a recording head 105 is mounted on a carriage 104 so as to be reciprocated in a longitudinal direction along a shaft 103. Ink discharged from the recording head 105 is deposited on a recording material 102, whose recording surface is regulated on a platen roller 101, to form an image thereon.

A discharge signal is supplied to the recording head 105 via a flexible cable 119 in accordance with image data. A carriage motor 114 causes the carriage 104 to perform scanning along the shaft 103. A wire 113 transmits the driving force of the motor 114 to the carriage 104. A conveyance motor 118 conveys the recording material 102 by being combined with the platen roller 101. The ink-jet recording apparatus is connected to a host computer, such as a personal computer or the like, via, for example, an IEEE (Institute of Electrical and Electronics Engineers, Inc.) 1284 interface, and records, upon reception of image data transmitted from the host computer, an image on the recording material 102 by a reciprocating operation of the carriage 104. After the lapse of a predetermined time period upon completion of the recording operation, the apparatus shifts to a waiting state.

In the recording head 105, recording elements for performing ink-jet recording are arranged. Each of the recording elements includes a driving unit and a nozzle. The driving unit can provide ink with heat using an electrothermal transducer (discharge heater). Film boiling occurs in the ink due to the heat, and the ink is discharged from the nozzle due to a change in the pressure that is produced by the growth or contraction of a bubble generated by the film boiling.

Figure 8:
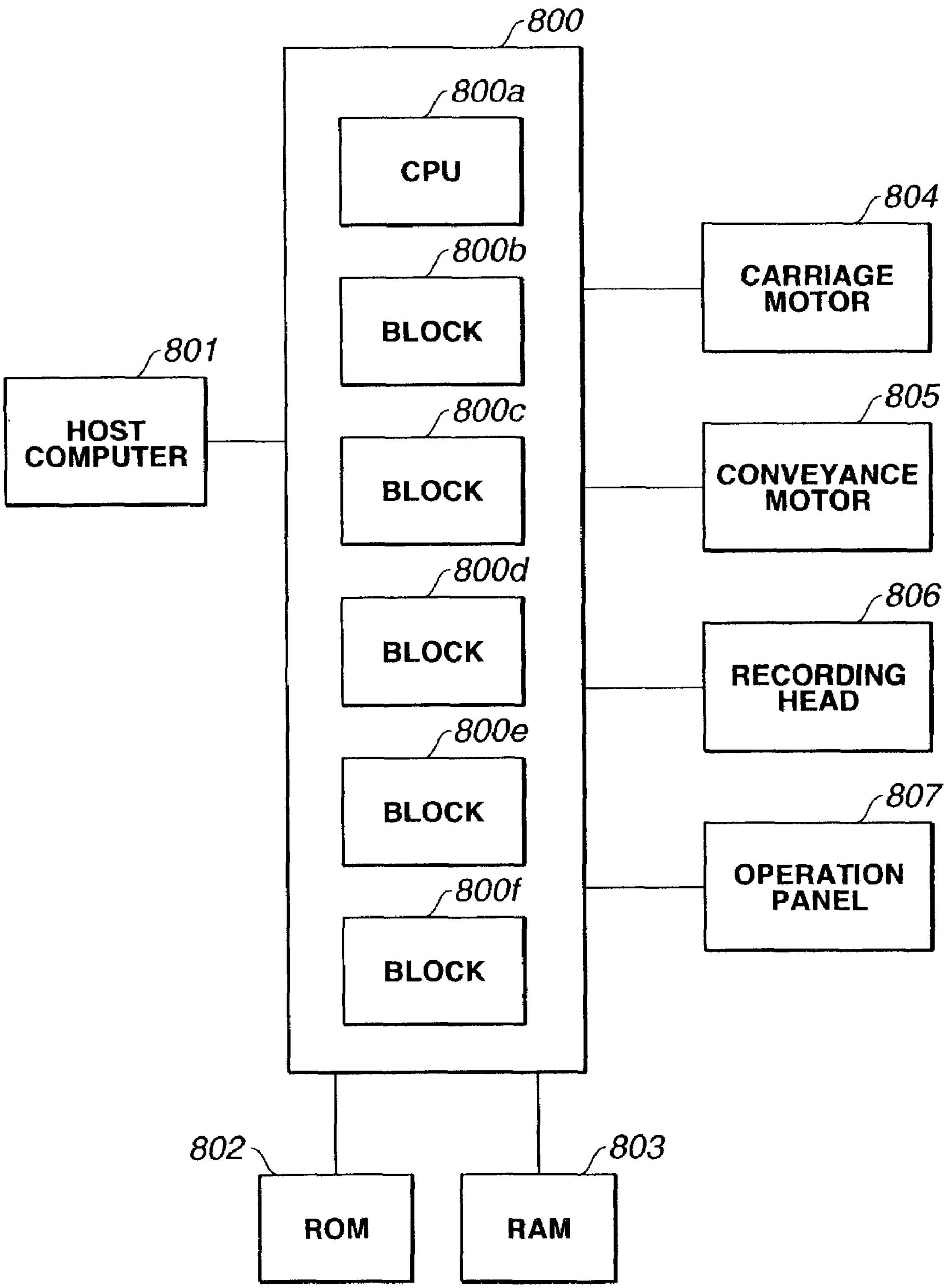
FIG. 8 is a block diagram illustrating a control circuit for controlling the printer shown in FIG. 1.

FIG. 8 is a block diagram illustrating a control circuit for controlling the ink-jet recording apparatus. In FIG. 8, there are shown an external apparatus 801, such as a host computer or the like, and an ASIC 800. A CPU 800*a* is included in the ASIC 800. The CPU 800*a* operates based on a control program stored in a ROM (read-only memory) 802. A RAM (random access memory) 803 includes a working area for the operation of the CPU 800*a*, a reception buffer storage for temporarily holding data from the external apparatus 801, a transfer buffer storage for storing data to be transmitted to the recording head 105 (shown in FIG. 1), and the like. There are also shown a carriage motor 804, a conveyance motor 805, a recording head 806, and an operation panel (operation unit/display unit) 807.

In addition to the CPU 800*a*, the ASIC 800 includes five circuit blocks 800*b*-800*f*, that perform control of the motors, control of the recording head 806, control of the operation/display panel 807, control of communication with the external apparatus 801 (a host computer, a portable apparatus, a digital camera or the like), and formation of recording data (processing of image data), respectively.

Each of the circuit blocks 800*b*-800*f* has two modes, i.e., an operation mode and a standby mode. In the operation mode, the recording apparatus performs a recording operation or the like. In the standby mode, the recording apparatus waits, and only a minimum function operates so that power consumption can be reduced. The CPU 800*a* can provide each of the circuit blocks with an instruction whenever necessary, and switch the mode of each of the circuit blocks.

The CPU 800*a* has three modes, i.e., a normal or operational mode, a halt mode and a stop mode. Power consumption in the halt mode or the stop mode is lower than power consumption in the ordinary mode. When the recording apparatus shifts into a waiting state, the CPU 800*a* shifts to the halt mode.

First Embodiment

Figure 2:
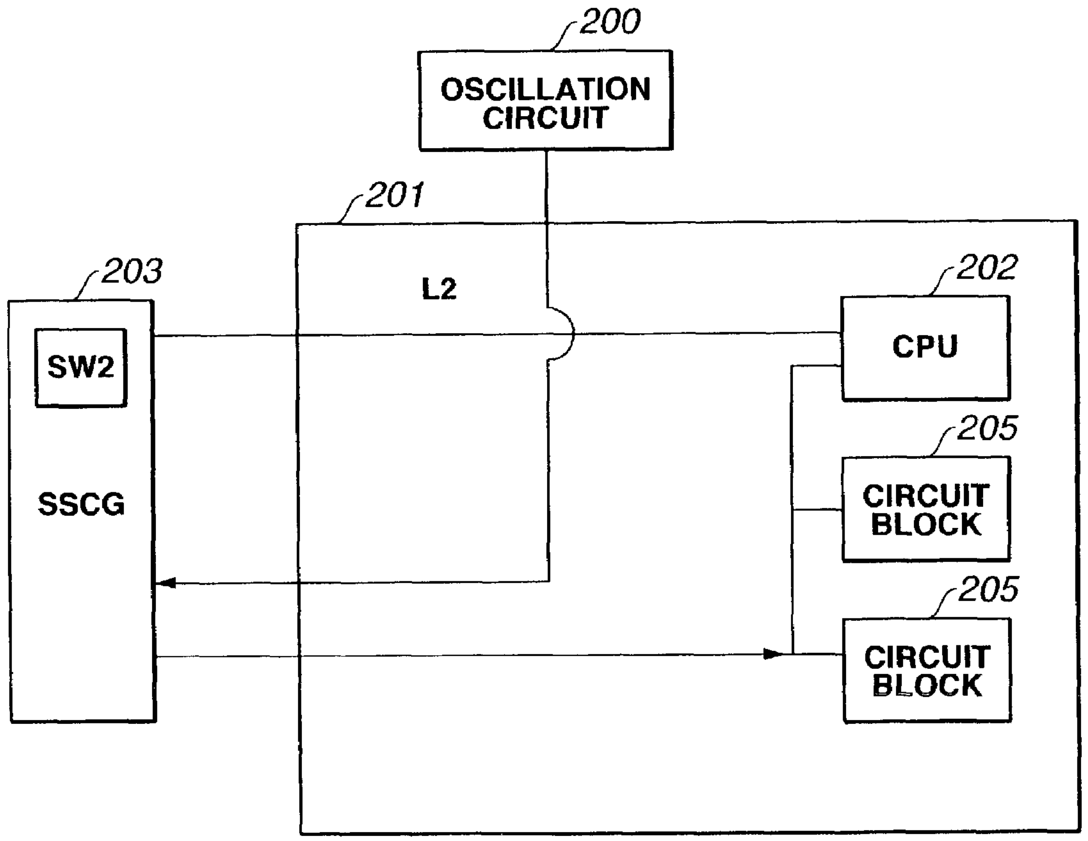
FIG. 2 is a block diagram illustrating a control circuit according to a first embodiment of the present invention.

FIG. 2 is a block diagram illustrating a control circuit according to a first embodiment of the present invention. In FIG. 2, an oscillation circuit 200 includes an oscillator for generating a clock signal for operating the control circuit. The clock signal generated in the oscillation circuit 200 is input to an ASIC 201, which includes a CPU 202. The clock signal output from the oscillation circuit 200 is input to a spectrum spread clock generator (SSCG) 203, and is converted into a spectrum spread clock signal. A current consumed in the SSCG 203 is, for example, about 20 mA.

The spectrum spread clock signal is supplied to circuits within the ASIC 201, i.e., the CPU 202 and circuit blocks 205. The SSCG 203 includes an on/off switch SW2 for a spectrum spread function. The on/off switch SW2 is switched by a control signal L2 (or an instruction) from the CPU 202.

When the ink-jet recording apparatus is in a waiting state, a control signal is output from the CPU 202 to switch off the on/off switch SW2 to an off-state, and a clock signal not subjected to spectrum spread is supplied to the circuit blocks 205. The ink-jet recording apparatus shifts into a waiting state, for example, when a recording operation has been terminated, by the user's operation on an operation panel, or when data reception from the host computer has been terminated. When the apparatus shifts to the waiting state, the circuit blocks 205 shift to the standby mode. After providing the circuit blocks 205 with a mode-shift instruction, the CPU 202 shifts, for example, from the normal or operational mode to the halt mode. As a result, the CPU 202 and the circuit blocks 205 shift into a low power consumption mode, so that the power consumption in the control circuit is reduced.

The circuit blocks 205 perform control of the operation/display panel and control of communication with the host computer. By detecting a change in a signal relating to a key input from the outside of the ASIC 201, or a signal from an interface, the circuit blocks 205 in the standby mode provide the CPU 202 with an instruction, such as an interrupt signal or the like. Upon receipt of the instruction, the CPU 202 causes the concerned circuit block to shift to the operation mode (or, if there is a change in a signal relating to a key input from the outside of the ASIC 201 or a signal from the interface, each circuit block in the standby mode may shift to the operation mode).

By performing switching to a clock signal not subjected to spectrum spread in a standby state, it is possible to suppress power consumption for frequency generation, and thus suppress power consumption in the ink-jet recording apparatus.

Second Embodiment

Figure 10:
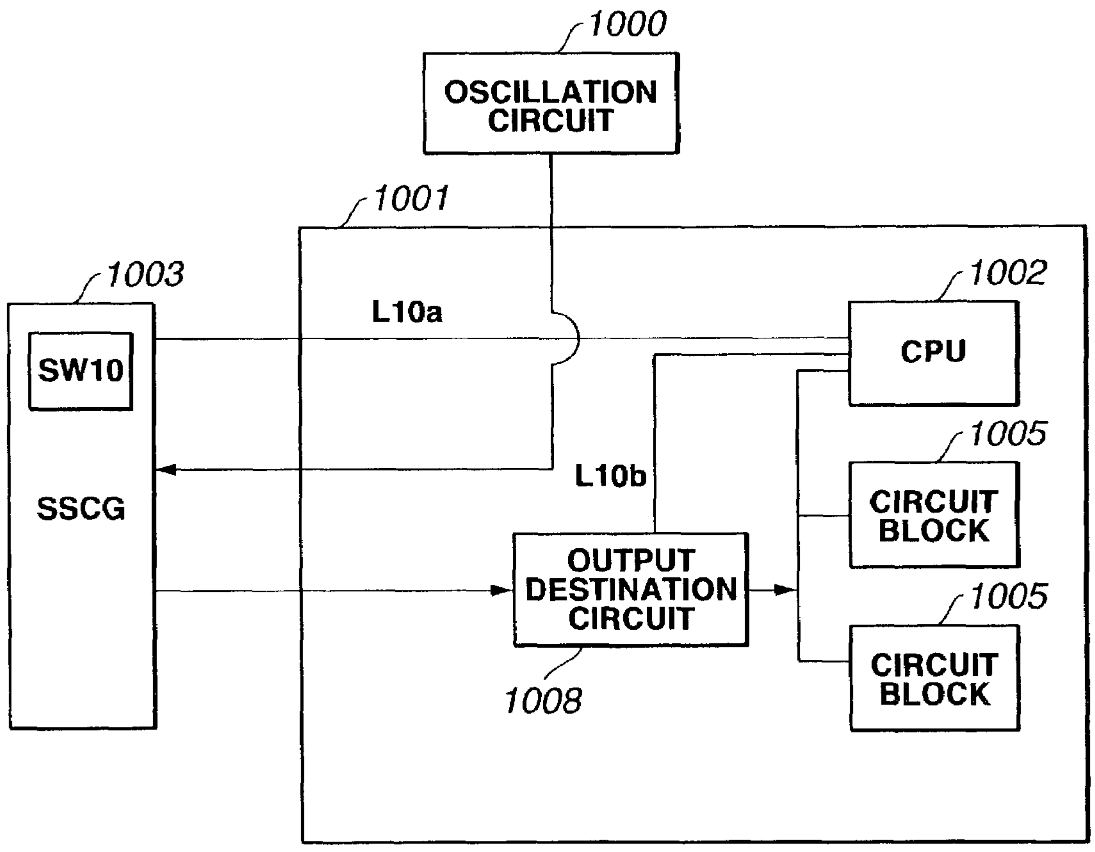
FIG. 10 is a block diagram illustrating a control circuit according to a second embodiment of the present invention.

FIG. 10 is a block diagram illustrating a control circuit according to a second embodiment of the present invention. The circuit shown in FIG. 10 differs from the circuit shown in FIG. 2 in that an output-destination selection circuit 1008 is added. A CPU 1002 outputs a control signal 1000 for the output-destination selection circuit 1008.

When a spectrum-spread-function switch SW10 of an SSCG 1003 is switched off, the SSCG 1003 stops its operation. As a result, a clock signal (not subjected to spectrum spread) output from an oscillation circuit 1000 is supplied to the output-destination selection circuit 1008 without being modified.

The output-destination selection circuit 1008 outputs this clock signal to a predetermined circuit block, for example, a circuit block for communicating with the host computer, or a circuit block for controlling an operation panel, in accordance with an instruction from the CPU 1002.

On the other hand, a clock signal is not output to circuit blocks that need not be controlled in a waiting state of the recording apparatus such as, for example, a circuit block for controlling the motors, a circuit block for controlling the recording head, and a circuit block for forming recording data.

By stopping the spectrum spread function of the SSCG 1003 and supplying only a predetermined circuit block with a clock signal, it is possible to perform switching so that a clock signal not subjected to spectrum spread is supplied only to a predetermined circuit block, and thus suppress power consumption in the control circuit.

Third Embodiment

Figure 3:
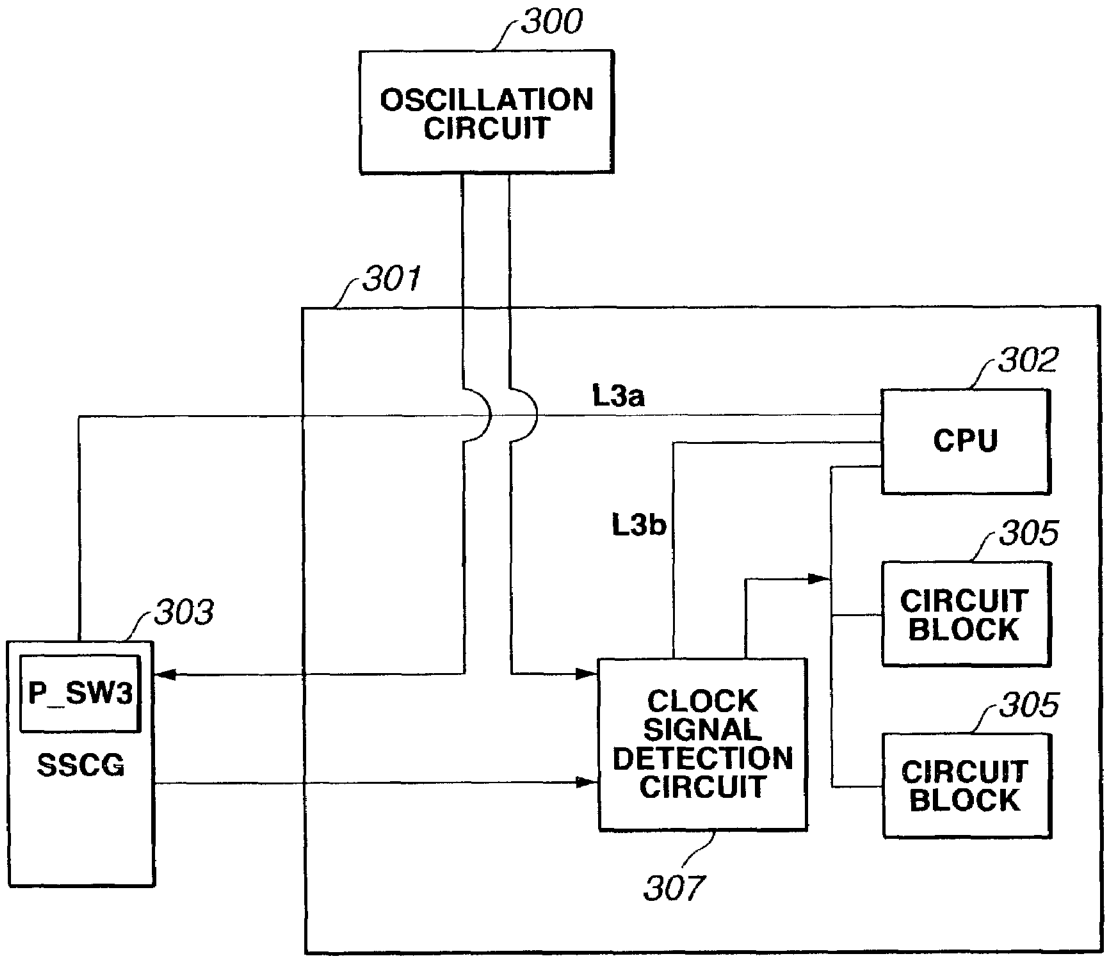
FIG. 3 is a block diagram illustrating a control circuit according to a third embodiment of the present invention.

FIG. 3 is a block diagram illustrating a control circuit according to a third embodiment of the present invention. The circuit shown in FIG. 3 differs from the circuit shown in FIG. 2 in that a clock-signal selection circuit 307 is added, and a power-supply on/off switch P_SW3 is provided in an SSCG 303. The switch P_SW3 is switched by a control signal L3*a* from a CPU 302.

When the power-supply on/off switch P_SW3 of the SSCG 303 is switched off, the operation of the SSCG is stopped. As a result, only a clock signal (not subjected to spectrum spread) output form an oscillation circuit 300 is supplied to the clock-signal selection circuit 307.

When the power-supply on/off switch P_SW3 is switched on, a clock signal subjected to spectrum spread is input to the clock-signal selection circuit 307 within an ASIC 301. The clock-signal selection circuit 307 can select one of the clock signal (not subjected to spectrum spread) output from the oscillation circuit 300 and a clock signal (subjected to spectrum spread) input from the SSCG 303, and supplies a selected clock signal to circuit blocks. The clock-signal selection circuit 307 is switched by a control signal L3*b* (or an instruction) from a CPU 302.

By turning off the power supply of the SSCG 303 in a standby state, power consumption in the SSCG 303 becomes zero, and the power consumption in the control circuit can be suppressed.

Fourth Embodiment

Figure 4:
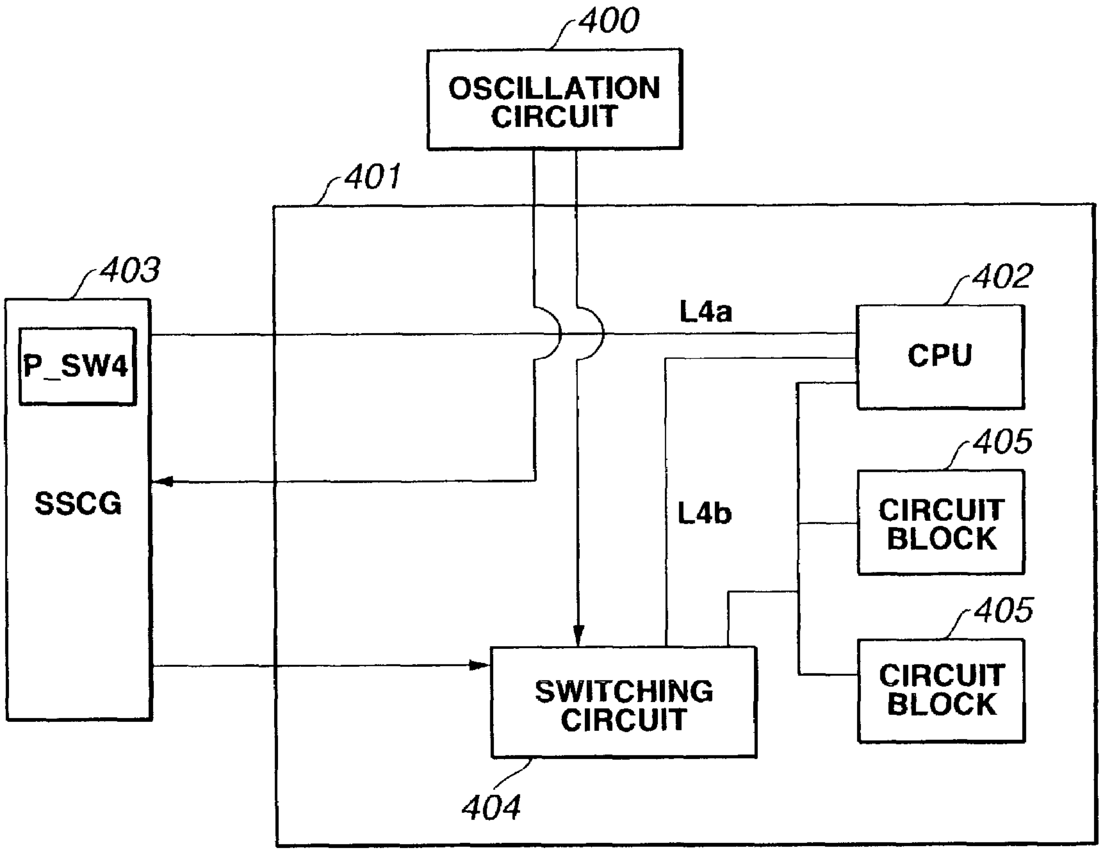
FIG. 4 is a block diagram illustrating a control circuit according to a fourth embodiment of the present invention.

FIG. 4 is a block diagram illustrating a control circuit according to a fourth embodiment of the present invention. The circuit shown in FIG. 4 differs from the circuit shown in FIG. 3 in that a switching circuit 404 is provided instead of the clock-signal selection circuit.

On/off of an SSCG 403 is switched by a control signal L4*a*.

The switching circuit 404 includes a clock-signal selection circuit and an output-destination selection circuit. By receiving a control signal L4*b*, the clock-signal selection circuit selects a clock signal, and the output-destination selection circuit can output a clock signal by selecting a circuit block to which the clock signal is to be output. If a circuit block is not selected, the clock signal is not output to that circuit block.

As described above, the clock signal selected by the clock-signal selection circuit is supplied to a predetermined circuit block selected by the output-destination selection circuit.

By turning off the power supply of the SSCG 403 in a standby state, and selecting a clock signal to be supplied to a circuit block and outputting the selected clock signal, power consumption in the control circuit can be suppressed by switching the clock signal supplied to the circuit block.

Fifth Embodiment

Figure 5:
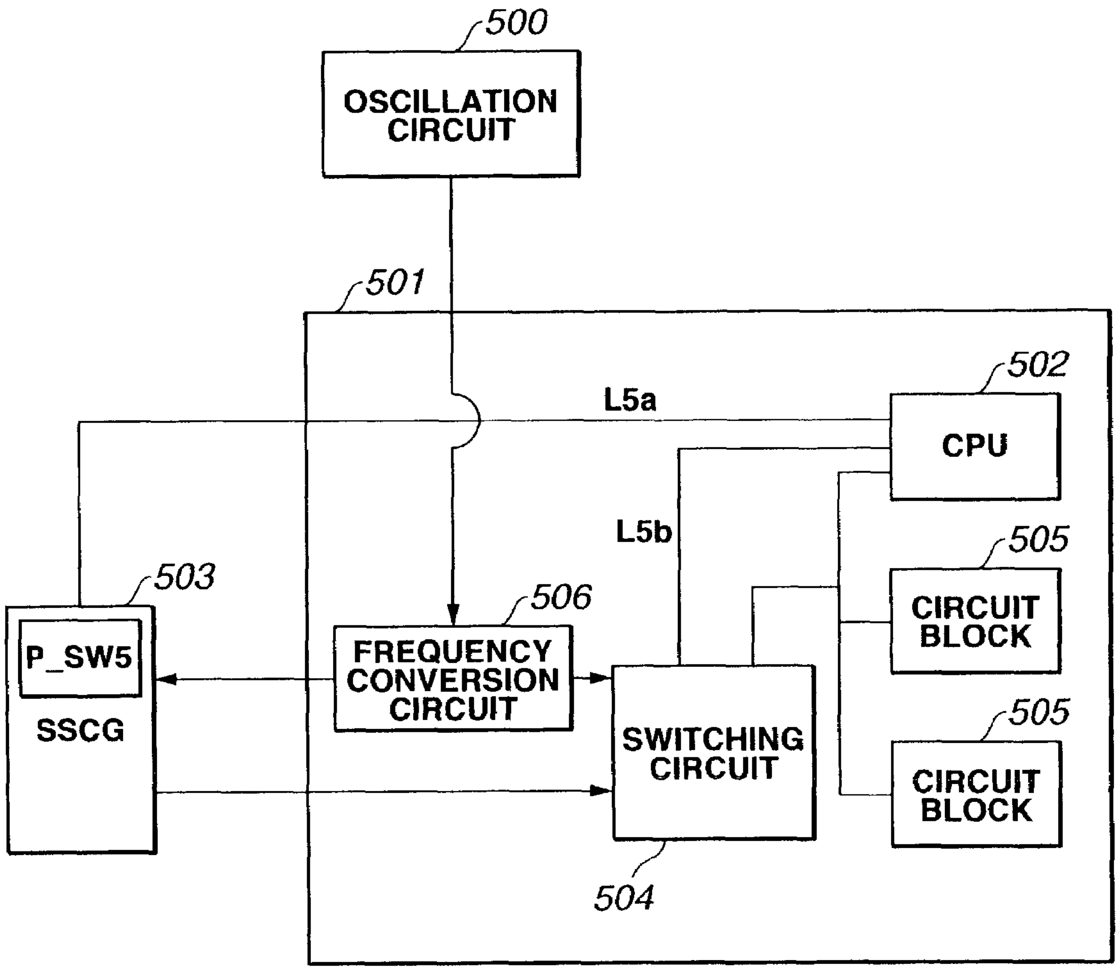
FIG. 5 is a block diagram illustrating a control circuit according to a fifth embodiment of the present invention.

FIG. 5 is a block diagram illustrating a control circuit according to a fifth embodiment of the present invention. The circuit shown in FIG. 5 is obtained by adding a frequency conversion circuit 506 to the control circuit shown in FIG. 4.

The frequency conversion circuit 5o6 converts a clock signal from an oscillation circuit 500 into a signal having a predetermined frequency. The frequency conversion circuit 506 performs frequency division by inputting a clock signal having a frequency A, and outputs a clock signal having a frequency B (lower than the frequency A) to a CPU 502 and circuit blocks 505.

By supplying a clock signal subjected to frequency division to circuit blocks in a standby state, power consumption in the circuit blocks is reduced, and power consumption in the control circuit can be further suppressed.

Sixth Embodiment

Figure 11:
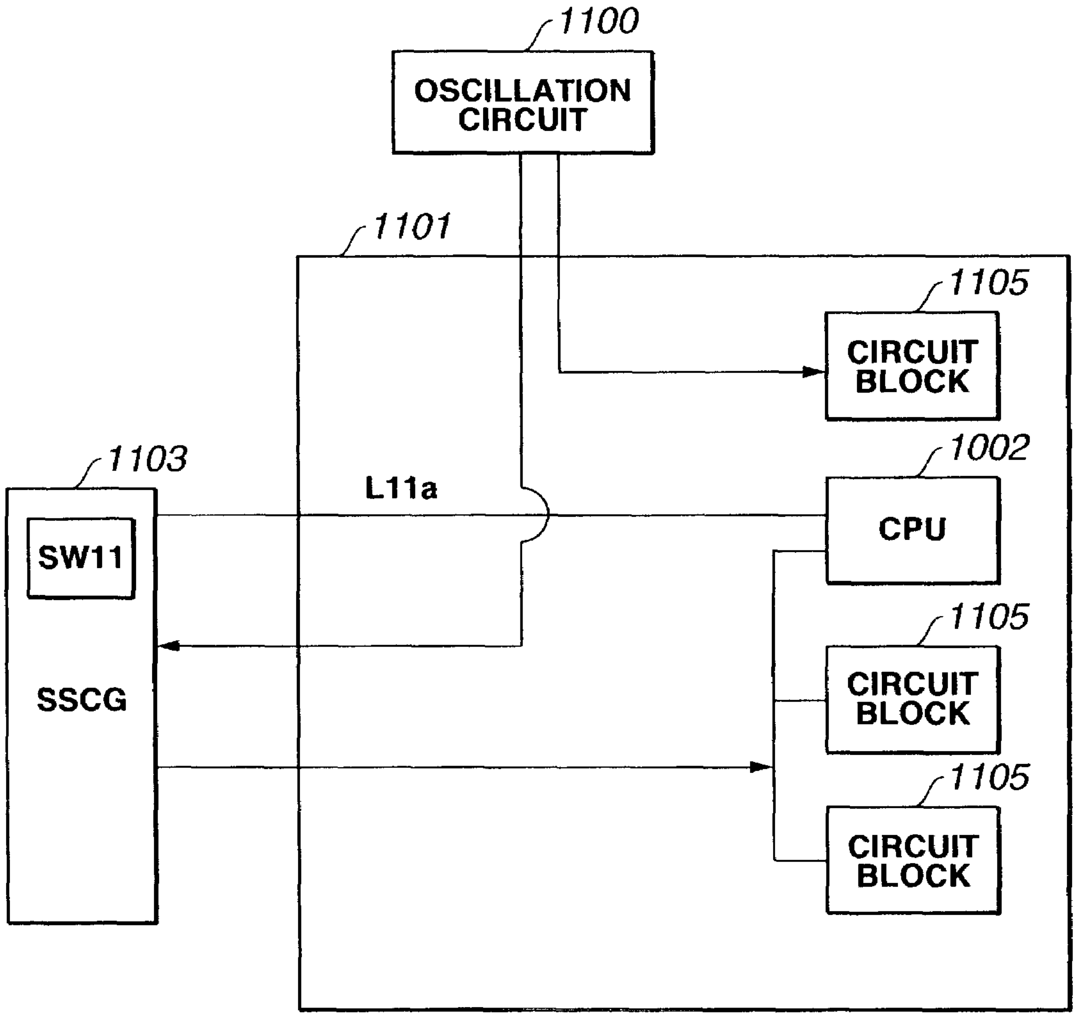
FIG. 11 is a block diagram illustrating a control circuit according to a sixth embodiment of the present invention.

FIG. 11 is a block diagram illustrating a control circuit according to a sixth embodiment of the present invention. The circuit shown in FIG. 11 differs from the circuit described in the first embodiment in that some of circuit blocks within the ASIC 1101 do not receive a clock signal from an SSCG 1103, and always operate with a clock signal output from an oscillation circuit 1100.

Such a circuit block is, for example, a USB (universal serial bus)-interface control block, because a USB interface is requested to operate with a signal not subjected to spectrum spread, in order to satisfy provisions relating to the USB.

By selecting a clock signal not subjected to spectrum spread in a standby state except for specific circuit blocks, power consumption in the control circuit can be suppressed.

Other Embodiments

Figure 6:
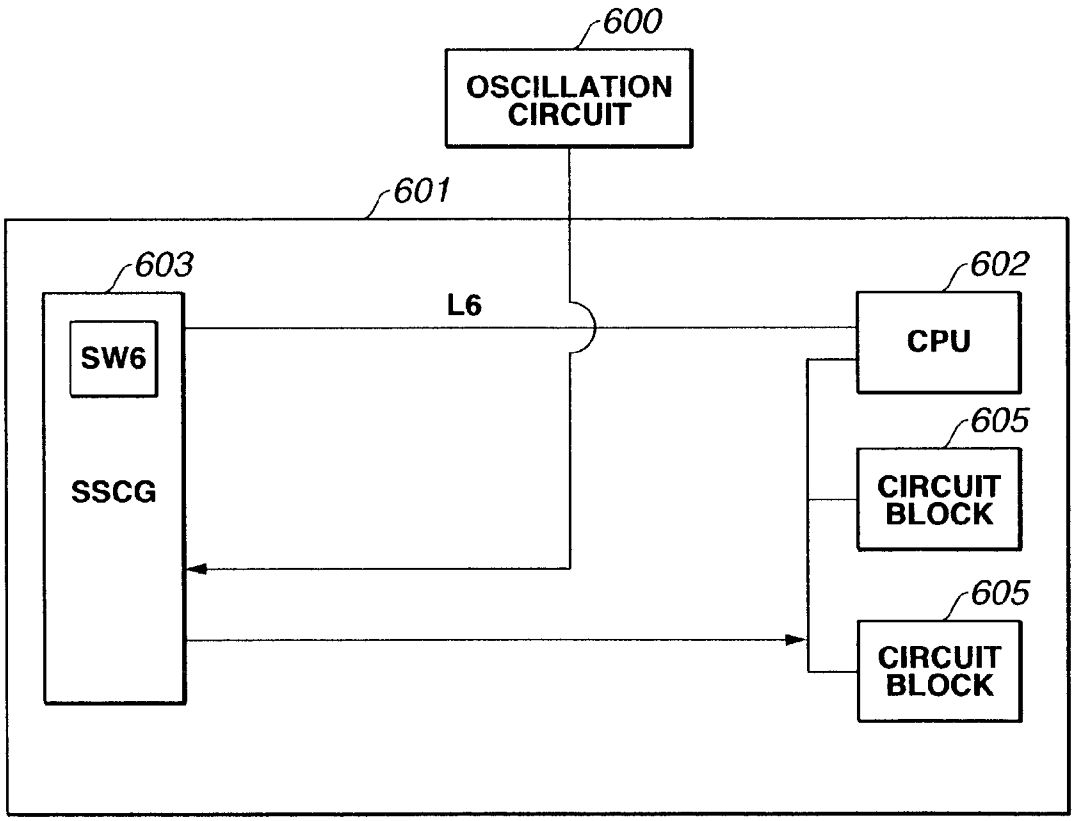
FIG. 6 is a block diagram illustrating a control circuit according to another embodiment of the present invention.

FIG. 6 is a block diagram illustrating a control circuit according to another embodiment of the present invention. In FIG. 6, an ASIC 601 includes a CPU 602, an SSCG 603, and circuit blocks 605. In the foregoing first through sixth embodiments, the SSCG is disposed outside of the ASIC. However, as shown in FIG. 6, the SSCG 603 may be incorporated within the ASIC 601. Furthermore, memory means, such as the ROM 802 or the RAM 803 shown in FIG. 8, may be incorporated within the ASIC 601 in order to provide a one-chip integrated circuit. It is thereby possible to realize reduction in the size and the production cost of a circuit.

Figure 7:
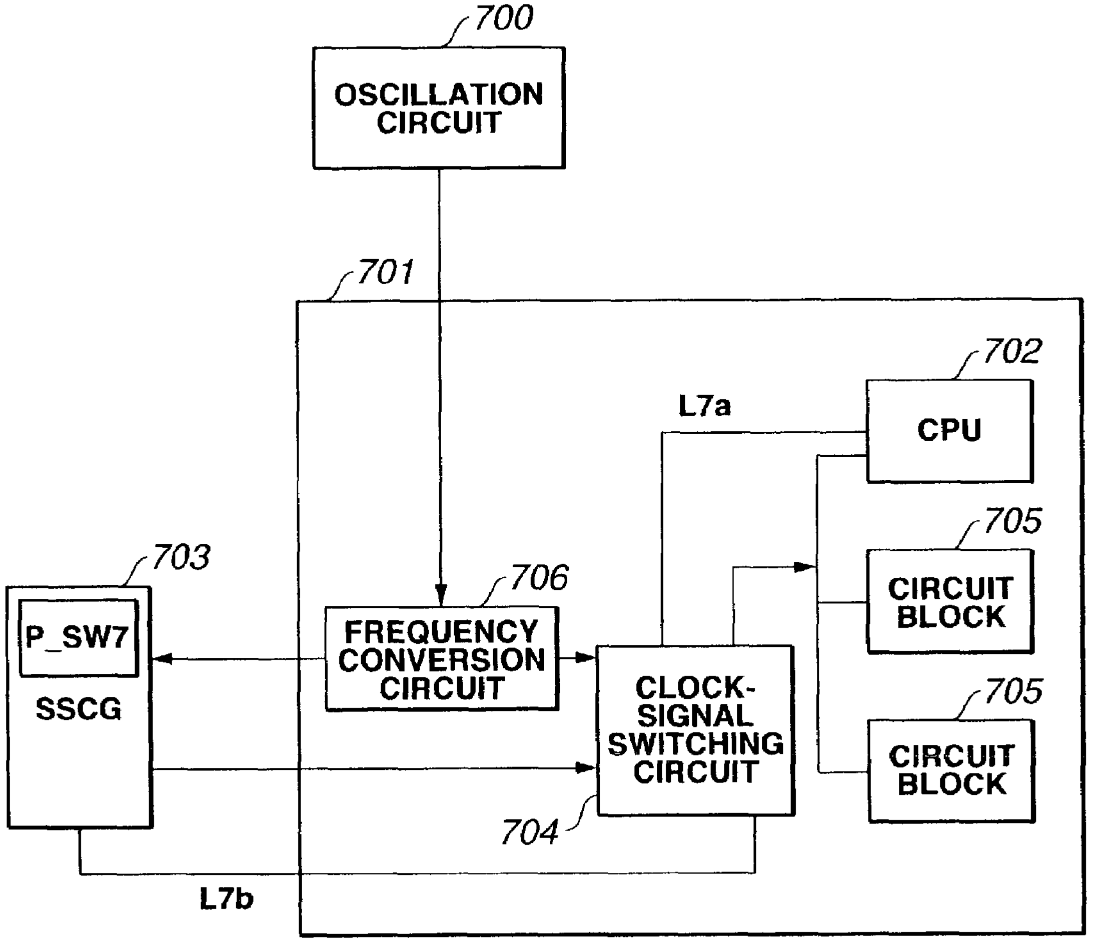
FIG. 7 is a block diagram illustrating a control circuit according to still another embodiment of the present invention.

FIG. 7 is a block diagram illustrating a control circuit according to another embodiment of the present invention in which a clock-signal switching circuit provides an SSCG with an instruction to switch a power supply on or off. In FIG. 7, an ASIC 701 includes a CPU 702, a clock-signal switching circuit 704, circuit blocks 705, and a frequency conversion circuit 706. Furthermore, as shown in FIG. 7, the clock-signal switching circuit 704 may provide an SSCG 703 with an instruction via signal L7*b* to switch a power supply on or off.

Figure 9:
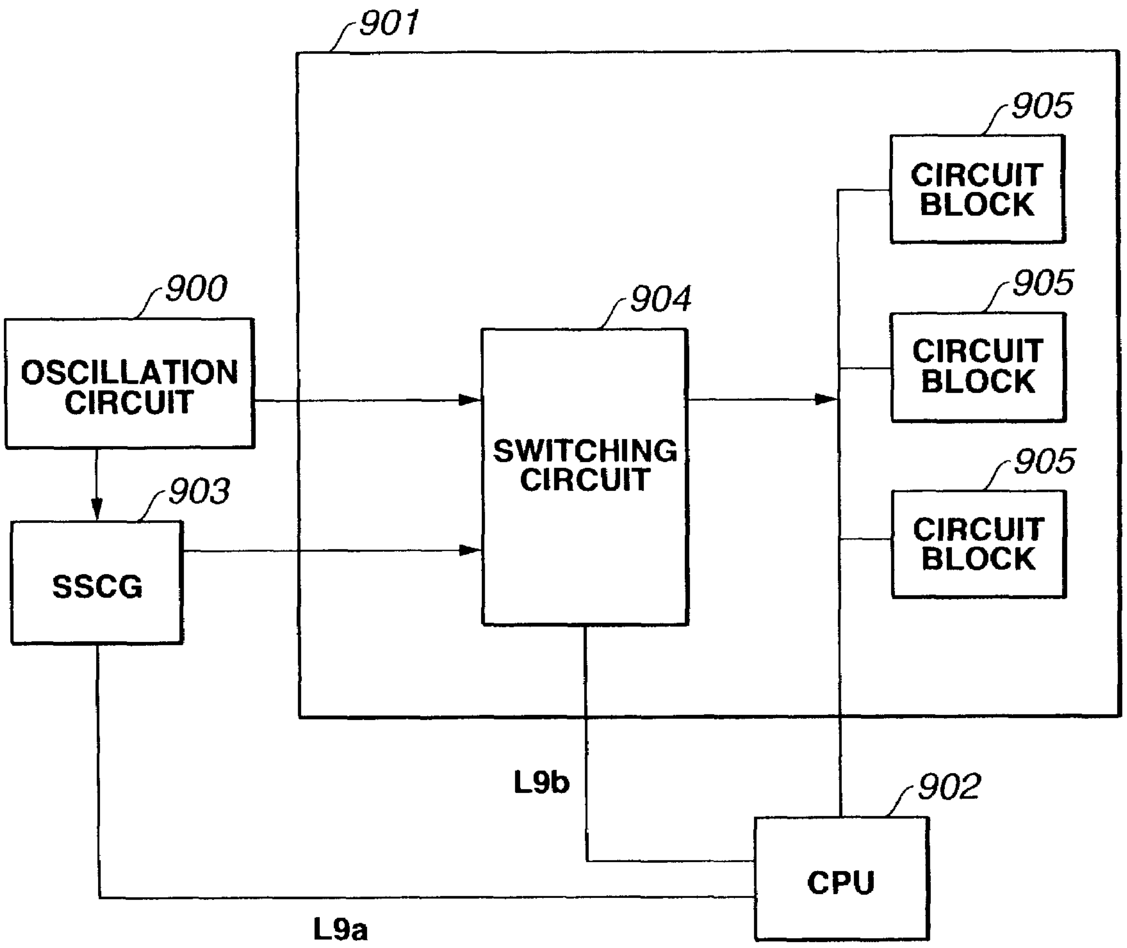
FIG. 9 is a block diagram illustrating a control circuit according to still another embodiment of the present invention.

FIG. 9 is a block diagram illustrating a control circuit according to another embodiment of the present invention. In FIG. 9, an ASIC 901 includes a switching circuit 904 and circuit blocks 905. In addition, a CPU 902 may be a control circuit provided outside of the ASIC 901.

In the foregoing embodiments, the CPU outputs a control signal for turning on/off the power supply (switching on/off the spectrum spread function) to the SSCG. However, for example, a control signal for turning on/off the power supply (switching on/off the spectrum spread function) may be output from a circuit block for performing control of electric power.

Although each of the foregoing embodiments is applied to the ink-jet recording apparatus using the recording head, each of the embodiments may also be applied to an image input apparatus using a mountable scanner cartridge instead of the recording head. In this case, a scanner control circuit block performs an image reading operation. Furthermore, each of the embodiments may also be applied to a computer, a portable apparatus or the like.

Although in the foregoing embodiments, an IEEE 1284 interface has been illustrated as an interface for communicating with an external apparatus, such as a host computer or the like, an interface conforming to any other appropriate standards, such as USB, IEEE 1394, or the like, may also be used. The number of circuit blocks for controlling an interface is not limited to one, but a plurality of circuit blocks may also be used.

The number of nozzles and the resolution of the recording head are not limited to the values described in the foregoing embodiments. In addition, a piezoelectric device may also be used as the driving unit for the recording element.

According to the present invention, by switching the operation of a clock-signal generation means in accordance with the operational state of an ASIC or the like, it is possible to reduce power consumption in the clock-signal generation means, and suppress total power consumption in the entire apparatus incorporating the ASIC.

The individual components shown in outline or designated by blocks in the drawings are all well known in the integrated circuit device and ink-jet recording apparatus arts and their specific construction and operation are not critical to the operation or the best mode for carrying out the invention While the present invention has been described with respect to what are presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A control circuit comprising:

an integrated circuit comprising a plurality of circuit blocks and a CPU (central processing unit), which operate based on clock signals;

a quartz oscillation circuit that outputs a first clock signal;

a spectrum spread clock generator that outputs a second clock signal having a frequency that is spread, for the plurality of circuit blocks, by inputting the first clock signal;

a selection circuit for inputting the first clock signal output from the quartz oscillation circuit and the second clock signal output from the spectrum spread clock generator, and for selecting a clock signal to be output for the plurality of circuit blocks and the CPU based on a first signal, wherein the spectrum spread clock generator is provided with a switch for changing on and off of a power source of the spectrum spread clock generator based on a second signal, and wherein the first signal and the second signal are output from the CPU in a case that the CPU shifts to a low-power-consumption mode, and the selection of the first clock signal by the selection circuit and turning off of the power source of the spectrum spread clock generator by changing the switch are performed, and wherein the integrated circuit comprises a frequency conversion circuit for outputting a third clock signal by dividing the frequency of the first clock signal, and the frequency conversion circuit outputs the third clock signal for a predetermined circuit block of the plurality of circuit blocks.

2. A control circuit according to claim 1, wherein at least one circuit block of the plurality of circuit blocks operates based on the first clock signal output from the quartz oscillation circuit all the time, regardless of the condition of the switch.

3. A control circuit according to claim 2, wherein a predetermined circuit block of the plurality of circuit blocks is for detecting a signal input from outside of the integrated circuit.

4. An ink-jet recording apparatus that performs recording using a recording head, said apparatus comprising:

an integrated circuit apparatus for controlling said ink-jet recording apparatus, the integrated circuit apparatus comprising:

a plurality of circuit blocks and a CPU, which operate based on clock signals;

a quartz oscillation circuit that outputs a first clock signal;

a spectrum spread clock generator that inputs the first clock signal and outputs a second clock signal having a frequency that is spread;

a selection circuit for inputting the first clock signal output from the quartz oscillation circuit and the second clock signal output from the spectrum spread clock generator, and for selecting a clock signal to be output for the plurality of circuit blocks and the CPU based on a first signal, wherein the spectrum spread clock generator is provided with a switch for changing on and off of a power source of the spectrum spread clock generator based on a second signal, and wherein the CPU outputs the first signal and the second signal in a case that the ink-jet recording apparatus shifts to a stand-by mode, and the selection of the first clock signal by the selection circuit and turning off of the power source of the spectrum spread clock generator by changing the switch are performed; and a frequency conversion circuit for outputting a third clock signal by dividing the frequency of the first clock signal, wherein the frequency conversion circuit outputs the third clock signal for a predetermined circuit block of the plurality of circuit blocks.

* * * * *

UNITED STATES PATENT AND TRADEMARK OFFICE

CERTIFICATE OF CORRECTION

PATENT NO. : 7,596,166 B2
APPLICATION NO. : 10/244517
DATED : September 29, 2009
INVENTOR(S) : Masayuki Hongou et al.

It is certified that error appears in the above-identified patent and that said Letters Patent is hereby corrected as shown below:

Title Page, (*) Notice: Subject to any disclaimer, the term of this patent is extended or adjusted under 35 U.S.C. 154(b) by 1053 days.

should read (*) Notice: Subject to any disclaimer, the term of this patent is extended or adjusted under 35 U.S.C. 154(b) by 1,541 days.

Signed and Sealed this

Twentieth Day of April, 2010

David J. Kappos
*Director of the United States Patent and Trademark Office*